US006977224B2

(12) United States Patent
Dubin et al.

(10) Patent No.: US 6,977,224 B2
(45) Date of Patent: Dec. 20, 2005

(54) METHOD OF ELECTROLESS INTRODUCTION OF INTERCONNECT STRUCTURES

(75) Inventors: Valery M. Dubin, Portland, OR (US); Christopher D. Thomas, Aloha, OR (US); Paul McGregor, Hillsboro, OR (US); Madhav Datta, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 254 days.

(21) Appl. No.: 09/753,256

(22) Filed: Dec. 28, 2000

(65) Prior Publication Data

US 2002/0084529 A1 Jul. 4, 2002

(51) Int. Cl.[7] ........................ H01L 21/44
(52) U.S. Cl. ........................ 438/678; 438/638
(58) Field of Search ........................ 438/687, 642, 438/638, 641, 674, 678

(56) References Cited

U.S. PATENT DOCUMENTS

| | | | |
|---|---|---|---|
| 4,574,094 A | 3/1986 | DeLuca et al. | |
| 4,574,095 A | 3/1986 | Baum et al. | |
| 4,789,648 A | 12/1988 | Chow et al. | |
| 4,894,260 A | 1/1990 | Kumasaka et al. | |
| 4,985,750 A | 1/1991 | Hoshino | |
| 5,012,058 A | 4/1991 | Smith, deceased | 219/10.55 |
| 5,151,168 A | 9/1992 | Gilton et al. | |
| 5,240,497 A | 8/1993 | Shacham et al. | |
| 5,612,254 A | 3/1997 | Mu et al. | |
| 5,674,787 A | 10/1997 | Zhao et al. | |
| 5,695,810 A | 12/1997 | Dubin et al. | |
| 5,719,759 A | 2/1998 | Wagner et al. | 363/132 |
| 5,739,579 A | 4/1998 | Chiang et al. | |
| 5,891,513 A | 4/1999 | Dubin et al. | |

(Continued)

FOREIGN PATENT DOCUMENTS

| | | | |
|---|---|---|---|
| EP | 1022770 A2 | 7/2000 | |
| JP | 62-270778 | 11/1987 | |
| JP | 11-146655 | 5/1999 | 7/48 |
| JP | 11288940 | 10/1999 | |
| JP | 2000-197368 | 7/2000 | 7/48 |
| WO | WO-03094209 | 11/2003 | |

OTHER PUBLICATIONS

Lopatin, S.D., et al., "Thin Electroless Barrier for Copper Films," Proceedings of the SPIE, vol. 3508, Bellingham, VA, Sept. 23, 1998, pp. 65–67.

Sambucetti, C.J., et al., "Electroless Deposition of Thin Alloys Layers for Metal Passivation and Solder Barriers," Electrochemical Society Proceedings, Pennington, NJ, Aug. 31, 1997, pp. 336–345.

(Continued)

*Primary Examiner*—Tuan H. Nguyen
(74) *Attorney, Agent, or Firm*—Blakely, Sokoloff, Taylor & Zafman LLP

(57) ABSTRACT

A method comprising introducing an interconnect structure in an opening through a dielectric over a contact point, and introducing a conductive shunt material through a chemically-induced oxidation-reduction reaction. A method comprising introducing an interconnect structure in an opening through a dielectric over a contact point, introducing a conductive shunt material having an oxidation number over an exposed surface of the interconnect structure, and reducing the oxidation number of the shunt. An apparatus comprising a substrate comprising a device having contact point, a dielectric layer overlying the device with an opening to the contact point, and an interconnect structure disposed in the opening comprising an interconnect material and a different conductive shunt material.

26 Claims, 4 Drawing Sheets

U.S. PATENT DOCUMENTS

| | | | | |
|---|---|---|---|---|
| 6,100,184 A | | 8/2000 | Zhao et al. | |
| 6,151,232 A | | 11/2000 | Furuhashi et al. | 363/97 |
| 6,153,935 A | | 11/2000 | Edelstein et al. | |
| 6,169,024 B1 | | 1/2001 | Hussein | |
| 6,174,812 B1 | | 1/2001 | Hsiung et al. | |
| 6,197,688 B1 | | 3/2001 | Simpson | |
| 6,207,556 B1 | | 3/2001 | Hsu | |
| 6,258,707 B1 | | 7/2001 | Uzoh | |
| 6,310,019 B1 | | 10/2001 | Kakizawa et al. | |
| 6,316,359 B1 | | 11/2001 | Simpson | |
| 6,342,733 B1 | | 1/2002 | Hu et al. | |
| 6,350,687 B1 | * | 2/2002 | Avanzino et al. | 438/618 |
| 6,358,832 B1 | * | 3/2002 | Edelstein et al. | 438/612 |
| 6,441,492 B1 | | 8/2002 | Cunningham | |
| 6,537,902 B1 | | 3/2003 | Orita | |
| 6,605,874 B2 | | 8/2003 | Leu et al. | |
| 6,680,540 B2 | | 1/2004 | Nakano et al. | |
| 2001/0030366 A1 | | 10/2001 | Nakano et al. | |
| 2001/0055873 A1 | | 12/2001 | Watanabe et al. | |
| 2002/0027261 A1 | | 3/2002 | Besser et al. | |
| 2002/0079589 A1 | | 6/2002 | Gayet et al. | |
| 2003/0148618 A1 | | 8/2003 | Parikh | |

OTHER PUBLICATIONS

Brusic, "Copper Corrosion With and Without Inhibitors," J. Electrochem. Soc., vol. 138, No. 8, pp. 2253–2258 (Aug. 1991).

Cho, et al., "Copper Interconnection with Tungsten Cladding for ULSI," 1991 Symposium on VLSI Technology, pp. 39–40 (May 1991).

Cho, et al., "Electroless Cu for VLSI," MRS Bulletin, pp. 31–38 (Jun. 1993).

Dubin, et al., "Selective Electroless Ni Deposition on a TiW Underlayer for Integrated Circuit Fabrication," Thin Solid Films, pp. 87–93 (1993).

Dubin, et al., "Selective and Blanket Electroless Cu Plating Initiated by Contact Displacement for Deep Submicron Via Contact Filling," VMIC Conference, pp. 315–321 (Jun. 1995).

Gardner, et al., "Encapsulated Copper Interconnection Devices Using Sidewall Barriers," VMIC Conference, pp. 99–108 (Jun. 1991).

Georgiou, et al., "Thick Selective Electroless–Plated Cobalt–Nickel Alloy Contacts to $CoSi_2$," J. Electrochem. Soc., vol. 138, No. 7, pp. 2061–2069 (Jul. 1991).

Jagannathan, et al., "Electroless Plating of Copper at a Low pH Level," J. Res. Develop., vol. 37, No. 2, pp. 117–123 (Mar. 1993).

Kiang, et al., "Pd/Si Plasma Immersion Ion Implantation for Selective Electroless Copper Plating on SiO2," Appl. Phys. Lett., vol. 60, No. 22, pp. 2767–2769.

Luther, et al., "Planar Copper–Polyimide Back End of the Line Interconnections for ULSI Devices," VMIC Conference, pp. 15–21 (Jun. 1993).

Mak, "Electroless Copper Deposition on Metals and Metal Silicides," MRS Bulletin, pp. 55–62 (Aug. 1994).

Murarka, et al., "Inlaid Copper Multilevel Interconnections Using Planarization by Chemical–Mechanical Polishing," MRS Bulletin, pp. 46–51 (Jun. 1993).

Paunovic, et al., "Electrochemically Deposited Diffusion Barriers," J. Electrochem. Soc., vol. 141, No. 7, pp. 1843–1850 (Jul. 1994).

Shacham–Diamand, "100 nm Wide Copper Lines Made by Selective Electroless Deposition," J. Micromech. Microeng., pp. 66–72 (1991).

Shacham–Diamand, et al., "0.35 $\mu$m Cu–Filled Via Holes by Blanket Deposited Electroless Copper on Sputtered Seed Layer," VMIC Conference, pp. 334–336 (Jun. 1995).

Sviridov, Electroless Metal Deposition from Aqueous Solution, Minsk Bielorussion State University, pp. 60–85 (1986).

Ting et al., "Selective Electroless Metal Deposition for Integrated Circuit Fabrication," J. Electrochem. Soc., vol. 136, No. 2, pp. 456–465 (Feb. 1989).Feb. 14, 2003.

Ueno, et al., "A Half–Micron Pitch Cu Interconnection Technology," 1995 Symposium on VLSI Technology, pp. 27–28 (1995).

Wang, "Barriers Against Copper Diffusion into Silicon and Drift Through Silicon Dioxide," MRS Bulletin, pp. 30–40 (Aug. 1994).

Wong, et al., "Electroless Copper Deposition for Multilevel Metallization," Mat. Res. Soc. Symp. Proc., vol. 203, pp. 347–356 (1991).

Hymes, et al., "Passivation of Copper by Silicide Formation in Dilute Silane," Conference Proceedings ULSI–VII, Materials Research Society; pp. 425–431 (1992).

Osaka, et al., "Preparation of CoB Soft Magnetic Thin Films by Electoless Plating," IEEE Translation Journal on Magnetics in Japan, vol. 6, No. 1, Jan. 1991, pp.85–90.

Watanabe, et al., "Direct Electroless Nickel Plating on Copper Circuits Using DMAB as a Second Reducing Agent," 1998 IEMT/IMC Proceedings, pp. 149–153.

Dubin, et al., "Selective Electroless Ni Deposition onto Pd–Activated Si for Integrated Circuit Fabrication," Thin Solid Films, 226, 1993, pp. 94–98.

Advanced Power Technology, "A New Generation of Power MOSFET Offers Improved Performance at Reduced Cost", By Ken Dierberger, 2001.

* cited by examiner

METHOD OF ELECTROLESS INTRODUCTION OF INTERCONNECT STRUCTURES

BACKGROUND OF THE INVENTION

1. Field of the Invention

The invention relates to integrated circuit processing and, more particularly, to the introduction and patterning of interconnections on an integrated circuit.

2. Description of Related Art

Modern integrated circuits use conductive interconnections to connect the individual devices on a chip or to send and/or receive signals external to the chip. Popular types of interconnections include aluminum alloy interconnections (lines) and copper interconnections (lines) coupled to individual devices, including other interconnections (lines) by interconnections through vias.

A typical method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, such as titanium nitride (TiN), tantalum (Ta), or tantalum nitride (TaN). The barrier layer serves, in one aspect, to inhibit the diffusion of the interconnection material that will subsequently be introduced in the via and trench into the dielectric. Next, a suitable seed material is deposited on the wall or walls of the via and trench. Suitable seed materials for the deposition of copper interconnection material include copper (Cu), nickel (Ni), and cobalt (Co). Next, interconnection material, such as copper, is introduced by electroplating or physical deposition in a sufficient amount to fill the via and trench and complete the interconnect structure. Once introduced, the interconnection structure may be planarized and a dielectric material (including an interlayer dielectric material) introduced over the interconnection structure to suitably isolate the structure.

Copper has become a popular choice of interconnection material for various reasons, including its low resistivity compared with the resistivity of aluminum or aluminum alloys. Nevertheless, copper interconnection material is not without its own limitations. One limitation is that copper does not adhere well to dielectric material. The barrier material on the side walls of a via and trench as explained above provides adhesion to the adjacent dielectric material. However, in the damascene process described above, no barrier material is present on the top of the interconnect material and, consequently, copper is typically in direct contact with the dielectric material. Poor adhesion of copper material to dielectric material contributes to electromigration by the copper material during, for example, current flow.

A second problem encountered by copper interconnection material involves the difficulty in completely filling a via with copper material. In a typical electroplating introduction process, voids can appear in the via. The voids tend to aggregate and create reliability issues for the interconnection. The voids also increase the resistance of the via.

Another limitation of copper interconnection material as it is currently introduced is the tendency of the formed interconnection to blister or form hillocks due to subsequent annealing steps typically encountered in the formation of integrated circuit devices at the wafer level. These blisters or hillocks disrupt the otherwise planarized layers of interconnections over the wafer.

What is needed are improved interconnect structures and techniques for improving the introduction and properties of an interconnection structure.

DETAILED DESCRIPTION

An integrated circuit is disclosed, as well as methods for forming such a circuit. In one embodiment, an interconnect structure including a conductive shunt material is described. The shunt material may, for example, overlie the interconnection material, such as overlie copper interconnection material in a trench and via; surround the interconnection material, such as by lining the walls of a trench and via; and/or substantially fill the via of a via and trench interconnection configuration. The conductive shunt material is selected, in one aspect, for the beneficial attributes toward improving an interconnect structure. In terms of interconnect structures comprising copper, for example, such attributes include, but are not limited to, improved adhesion to dielectric material, reduction of hillocks or blistering, and reduction of electromigration.

In another embodiment, a technique for introducing a shunt material is described. That technique involves a chemically-induced oxidation-reduction reaction process described also as an electroless plating process. The electroless process allows a shunt material to be selectively introduced where desired such as on surfaces where an oxidation-reduction reaction can occur. The electroless process described herein also does not require a preliminary activation step to introduce the shunt material. Further, by controlling the components involved in the oxidation-reduction or electroless process (e.g., reducing agents, chelating agents, pH modifiers, catalysts, etc.) the introduction of contaminant species into the interconnection material or shunt material is reduced.

Figure 1:
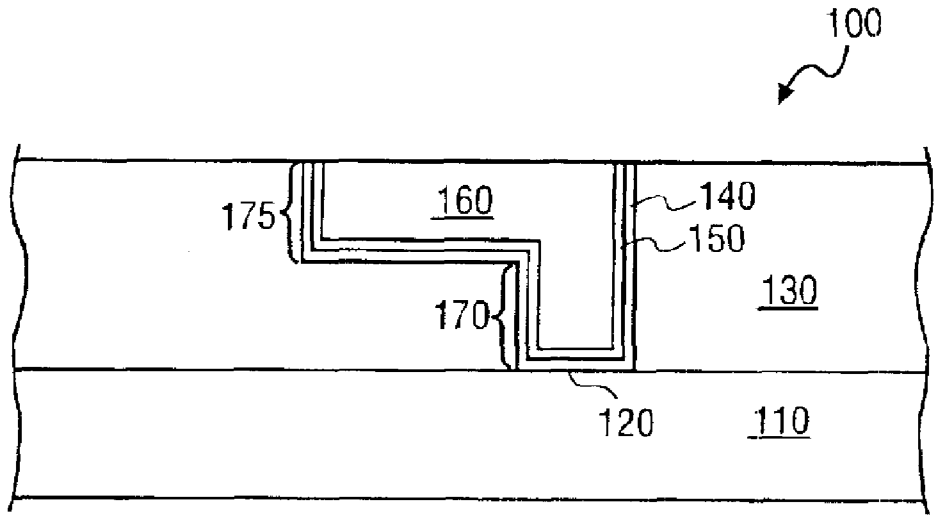
FIG. 1 shows a schematic, cross-sectional side view of an interconnect structure according to an embodiment of the invention.

FIG. 1 shows a typical integrated circuit structure, such as a portion of a microprocessor chip on a silicon wafer. A typical integrated circuit such as a microprocessor chip may have, for example, four or five interconnection layers or levels separated from one another by dielectric material.

Structure 100 includes an interconnection line over substrate 110. Substrate 110 may be the wafer substrate having circuit devices, including transistors, thereon as well as one or more levels of interconnection to devices. FIG. 1 shows contact point 120 that may be a circuit device formed on or in a wafer or an interconnection line formed above the wafer to devices on the wafer. It is to be appreciated that the techniques described herein may be used for various interconnections within an integrated circuit including to circuit devices and other interconnections. In this sense, contact point 120 represents such devices or interconnections where an interconnection contact is made.

FIG. 1 illustrates a cross-sectional side view of a portion of a substrate. Overlying substrate 110 is dielectric material 130. Dielectric material 130 is, for example, silicon dioxide ($SiO_2$) formed by a tetraethyl orthosilicate (TEOS) or a plasma enhanced chemical vapor deposition (PECVD) source. Dielectric material 130 may also be a material having a dielectric constant less than the dielectric constant of $SiO_2$ (e.g., a "low k" material), including polymers as known in the art.

FIG. 1 shows via 170 through dielectric material 130 to expose contact point 110. FIG. 1 also shows trench 175 formed in a portion of dielectric material 130 over via 170. A trench and via may be formed according to known techniques by, for example, initially using a mask, such as a photoresist mask to define an area (e.g., a cross-sectional area) for a via opening and etching the via with a suitable chemistry, such as, for example, a $CH_3/CF_4$ or $C_4F_8$ etch chemistry for $SiO_2$. The mask may then be removed (such as by an oxygen plasma to remove photoresist) and a second mask patterned to define a greater area (e.g., a greater cross-sectional area) for a trench opening. A subsequent mask and etch is introduced to form a trench and the second mask is removed leaving the substrate shown in FIG. 1.

FIG. 1 also shows the substrate having barrier material 140 formed along the side walls of the via and trench opening. In one embodiment, barrier material 140 deposited through a thickness of approximately 10–50 nanometers (nm) depending on the desired characteristics of the barrier material. For example, barrier material 140 is chosen, in one embodiment, to be effective to inhibit interconnect material diffusion, such as copper diffusion into dielectric material 130. Barrier material 140 may also be chosen for its adhering properties to dielectric material 130. Suitable materials for barrier material 140 include tantalum (Ta), tantalum nitride (TaN), tantalum silicon nitride (TaSiN), tungsten (W), tungsten nitride (WN), tungsten silicon nitride (WSiN), titanium (Ti), titanium nitride (TiN), titanium silicon nitride (TiSiN), and cobalt (Co). Barrier material 140 may be introduced by conventional techniques, such as chemical vapor deposition. In one embodiment, barrier material 140 is introduced as a blanket over dielectric material 130 and along the side walls and bottom of via 170 and along the side walls of trench 175.

Referring to FIG. 1, overlying barrier material 140 as a blanket including along the side walls and bottom of via 170 and trench 175 is seed material 150. Seed material 150 is used, in one sense, in connection with a subsequent electroplating process to form an interconnection in via 170 and trench 175. While barrier material may be a conductive material such as a titanium compound that may be capable of carrying a current utilized in an electroplating process, barrier material 140 may also not be a good conductor and may cause non-uniform current flow which, in turn, may adversely affect the electroplating process and the reliability of the interconnection. Seed material 150, on the other hand, generally provides uniform current flow during electroplating. Moreover, seed material 150 provides enhanced adhesion of the subsequently formed interconnection to the substrate.

In one embodiment, seed material is, for example, a copper material introduced using standard chemical or physical deposition techniques. A thickness of seed material 150 along the side walls and bottom of via 170 and trench 175 of less than 3,000 angstroms (Å) is suitable.

FIG. 1 shows structure 100 after filling via 170 and trench 175 with interconnection material 160 of, for example, a copper material. The typical introduction technique for a copper interconnection material as noted above is an electroplating process. By way of example, a typical electroplating process involves introducing a substrate (e.g., a wafer) into an aqueous solution containing metal ions, such as copper sulfate-based solution, and reducing the ions (reducing the oxidation number) to a metallic state by applying current between substrate with seed material 160 and an anode of an electroplating cell in the presence of the solution. Copper metal is deposited on to seed material 150 to fill via 170 and trench 175 and formed a copper interconnection material 160.

In one embodiment, interconnection material 160 is copper or a copper alloy. Suitable copper alloys include copper tin (CuSn), copper-indium (CuIn), copper-cadmium (CuCd), copper-zinc (CuZn), copper-bismuth (CuBi), copper-ruthenium (CuRu), copper-rhodium (CuRh), copper-rhenium (CuRe), copper-tungsten (CuW), copper-cobalt (CuCo), copper-palladium (CuPd), copper-gold (CuAu), copper-platinum (CuPt), and copper-silver (CuAg). Alloys are generally formed by one of two methods. Typically, copper-tin, copper-indium, copper-cadmium, copper-bismuth, copper-ruthenium, copper-rhenium, copper-rhodium, and copper-tungsten are electroplated. Alternatively, copper may be doped with catalytic metals such as silver, platinum, tin, rhodium, and ruthenium by introducing a contact displacement layer on top of planarized copper interconnection material (see next paragraph) and annealing to form an alloy.

Structure 100 may be planarized such as by a chemical-mechanical polish as known in the art to dielectric material 130 to remove barrier material 140, seed material 150, and any interconnection material 160 present on the upper surface of dielectric material 130. FIG. 1 shows structure 100 having interconnect material 160, seed material 150 and barrier material 140 introduced into via 170 and trench 175 with the surface of dielectric material 130 and the interconnect structure planarized.

Figure 2:
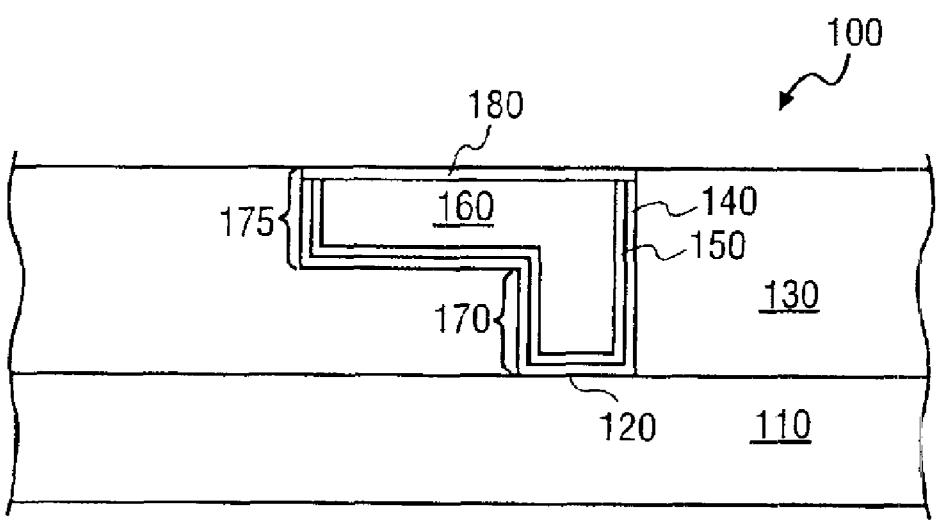
FIG. 2 shows the structure of FIG. 1 after the introduction of a shunt material cap.

FIG. 2 shows the substrate of FIG. 1 after the further introduction of conductive shunt material 180 to the superior or exposed surface of the interconnect structure. Shunt material 180 is introduced, in one aspect, to improve the adhesion between interconnection material 160 and an overlying, subsequently introduced dielectric. By improving the adhesion between the interconnect structure and the subsequently introduced dielectric, the electrical migration of the interconnect structure, particularly during current flow through the interconnect structure, may be improved over prior art configurations. In a second aspect, the presence of shunt material 180 over interconnect material 160 reduces the tendency of blistering or hillock formation of interconnect material 160 due to subsequent annealing steps in the fabrication of an integrated circuit device. A further advantage of including shunt material 180 is that such material may serve as an etch stop in subsequent etching operations to the interconnect structure.

One technique for introducing shunt material 180 is through a chemically-induced oxidation-reduction reaction also referred to herein as electroless plating. Unlike an electroplating process, an electroless plating process is not accomplished by an externally-supplied current, but instead relies on the constituents of the plating process (e.g., constituents of a plating bath) to initiate and carry out the plating process. One technique involves placing structure 100 in a bath containing one or more metal ions to be plated or introduced onto the exposed conductive surfaces (e.g., conductive material 160, seed material 150, and barrier material 140) as shunt material 180; and one or more reducing agents to reduce the oxidation number of the metal ions. As described, the refractory, noble and/or transition metals are introduced in an ionic state with a positive oxidation number. Since the metals are in an ionic state having a positive oxidation number, they are in a sense shunt material precursors.

In one embodiment, the shunt material includes cobalt or nickel, or an alloy of cobalt or nickel. Suitable cobalt alloys include, but are not limited to cobalt phosphorous (CoP), cobalt-boron (CoB), cobalt-phosphorous-boron (CoPB), cobalt-metal-phosphorous (CoMeP), cobalt-metal-boron (CoMeB), and cobalt-metal-phosphorous-boron (CoMePB). As used herein, "Me" includes, but is not limited to nickel (Ni), copper (Cu), cadmium (Cd), zinc (Zn), gold (Au), silver (Ag), platinum (Pt), ruthenium (Ru), rhodium (Rh), palladium (Pd), chromium (Cr), molybdenum (Mo), iridium (Ir), rhenium (Re), and tungsten (W). The use of refractory metals (e.g., W, Re, Ru, Rh, Cr, Mo, Ir) improve the properties of shunt material 180 by improving the adhesive properties of the shunt material as well as the mechanical hardness of shunt material 180. Combining Co and/or Ni material with a noble metal (e.g., Au, Ag, Pt, Pd, Rh, Ru) allows the noble metals to act as a catalytic surface for the electroless plating on Cu and Cu alloys lines/vias. The use of metals such as Ni, Cu, Cd, Zn, Pd, Au, Ag, Pt, Sn, Rh, and Ru allow direct introduction (e.g., deposition) of the shunt material onto barrier material. Phosphorous (P) and boron (B) are added to the shunt material as a result of reducing agent oxidation. P and B tend to improve the barrier and corrosion properties of the shunt material.

Without wishing to be bound by theory, it is believed that the exposed conductive surfaces on structure 100, when exposed to the components of the bath, undergo an oxidation-reduction (REDOX) reaction. The oxidation number of the metal ions of the introduced shunt metal elements are reduced while the oxidation number of the reducing agent(s) are increased. Noble metals such as Au, Ag, Pt, Pd, Rh, and Ru can also displace exposed copper metal in structure 100, the displaced copper metal being oxidized to copper ions (e.g., contact displacement). In terms of introducing metal ions of cobalt, metal ions (shunt material precursors) such as cobalt supplied by cobalt chloride, cobalt sulfate, etc., are introduced in a concentration range, in one embodiment, of about 10–70 grams per liter (g/l), alone or with the addition of compound containing metal ions of a desired alloy constituent (e.g., Ni, Cu, Cd, Zn, etc.). Examples of suitable additional compounds include ammonium tungstate (for alloying with W), ammonium perrhenate (for alloying with Re), etc. A suitable concentration range for the additional compound(s) includes 0.1 to 10 g/l.

To introduce the metal ions onto a conductive surface such as copper, tantalum or titanium, the oxidation number of the introduced metal ions is reduced. To reduce the oxidation number of the metal ions, one or more reducing agents are included in the bath. In one embodiment, the reducing agents are selected to be alkaline metal-free reducing agents such as ammonium hypophosphite, dimethylamine borate (DMAB), and/or glyoxylic acid in a concentration range of about 2 to 30 g/l. The bath may also include one or more alkaline metal-free chelating agents such as citric acid, ammonium chloride, glycine, acetic acid, and/or malonic acid in the concentration range of about 5 to 70 g/l for, in one respect, complexing copper. Still further, one or more organic additives may also be included to facilitate hydrogen evolution. Suitable organic additives include Rhodafac RE-610™, cystine, Triton x-100™, polypropylene glycol (PPG)/polyethylene glycol (PEG) (in a molecular range of approximately 200 to 10,000) in a concentration range of about 0.01 to 5 g/l. An alkaline metal-free pH adjuster such as ammonium hydroxide ($NH_4OH$), tetramethyl ammonium hydroxide (TMAH), tetraethyl ammonium hydroxide (TEAH), tetrapropyl ammonium hydroxide (TPAH), and/or tetrabutyl ammonium hydroxide (TBAH), may further be included in the bath to achieve a suitable pH range, such as a pH range of 3 to 14. A representative process temperature for an electroless plating bath such as described is on the order of 30 to 90° C.

By using metal-free reducing agents, additives, and pH adjusters, the plating bath contains no metals other than those desired for plating. Significantly, the plating bath, in one embodiment, does not contain potassium or sodium as typically used in prior art plating operations. Metal ions present in the bath such as potassium and sodium can contaminate a plated material. By using metal-free components, the risk of contamination is minimized. Another advantage of the described bath and the electroless process is that the plating operation may be accomplished without an activation step as previously used in typical plating processes. Still further, the use of more than one reducing agent allows various alloys to be introduced as shunt material 180.

As described, the chemically-induced oxidation-reduction reaction or electroless plating process introduces (e.g., plates) shunt material 180 to exposed conductive surfaces (e.g., metals) amenable to a chemically-induced oxidation-reduction reaction. Prior to the plating operation, the surface of the exposed conductive material on structure 100 can be treated to improve the uniformity of the electroless plating of shunt material 180. In the case of surface treating the exposed conductive surfaces to improve uniformity of electroless shunt material plating, the exposed conductive material may be surface treated with an agent such as a 1 to 20 percent by volume hydrofluoric acid (HF), sulfuric acid ($H_2SO_4$), sulfonic acids such as methanesulfonic acid (MSA) ethanesulfonic acid (ESA), propanesulfonic acid (PSA), and/or benzene sulfonic acid (BSA) for cleaning of copper interconnect material.

Prior to the electroless plating process, interconnection material 160 may also be doped. In the case of doping of copper interconnection material with, for example, paladium, the doping may be accomplished by introducing a palladium activation solution. Suitable activation solutions include palladium chloride (0.01 to 2 g/l) and hydrochloric acid (0.01 to 30 milliliters per liter (ml/l)), acetic acid (100–600 ml/l), hydrofluoric acid or ammonium fluoride (1 to 70 g/l). If doping of copper lines with gold (Au), platinum (Pt), silver (Ag), tin (Sn), rhodum (Ru), and/or rutherium (Ru) is required, such metals can be introduced to the copper interconnect material by contact displacement from solutions containing the metal salts and acids such as hydrochloric acid, hydrofluoric acid, sulfuric acid, and nitric acid.

FIG. 2 shows an interconnect structure having a shunt material as a cap or overlying structure. As a non-limiting example, a shunt material having a thickness on the order of 5 to 300 nanometers (nm) is suitable.

Figure 3:
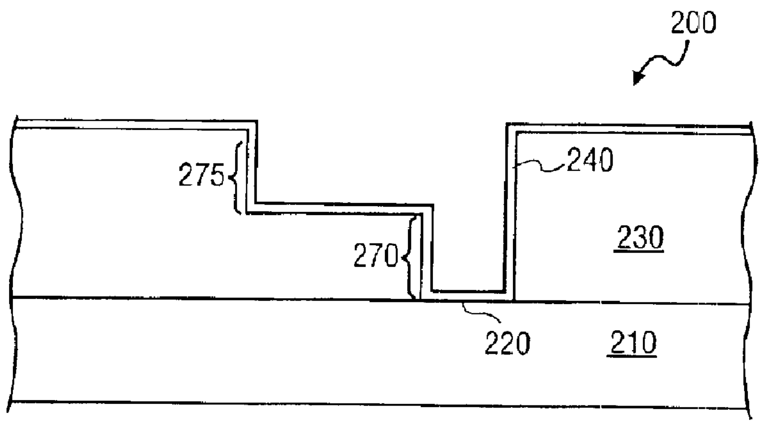
FIG. 3 shows a schematic, cross-sectional side view of an interconnect structure formed in a dielectric material and lined with barrier material in accordance with a second embodiment of the invention.

FIGS. 3–6 illustrate a second embodiment wherein conductive shunt material is used to encapsulate an interconnect material. Referring to FIG. 3, a cross-section of a portion of an integrated circuit structure similar to that described with respect to FIG. 1 is shown. Structure 200 includes substrate 210 with contact point 220 that is a circuit device such as a transistor or an underlying interconnect structure. Via 270 and trench 275 are formed in dielectric material 230 overlying structure 210. Barrier material 240 of, for example, tantalum, tantalum nitride, tantalum silicon nitride, tungsten, tungsten nitride, tungsten silicon nitride, titanium, titanium nitride, titanium silicon nitride, or cobalt line the side walls and bottom of via 270 and trench 275. Optionally, a seed material (not shown) may overly barrier material 240 and via 270 and trench 275.

Figure 4:
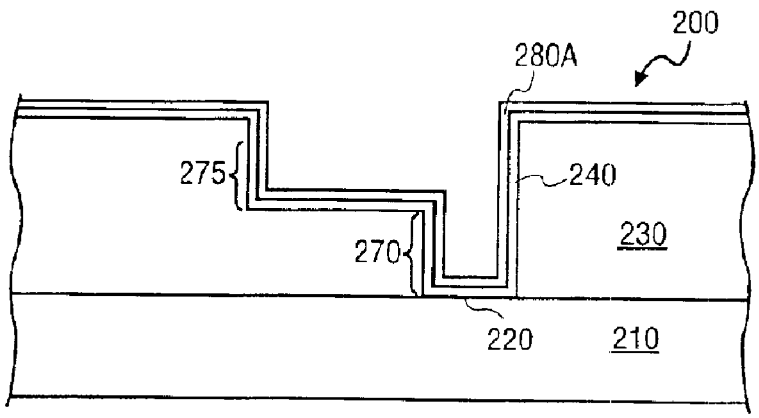
FIG. 4 shows the structure of FIG. 3 after the introduction of shunt material over the barrier material.

FIG. 4 shows structure 200 of FIG. 3 after the introduction of shunt material 280A. With reference to FIG. 2 and the accompanying text regarding introduction of shunt material 180, shunt material 280A may be introduced in a similar manner by way of a chemically-induced oxidation reduction reaction or electroless plating process over the exposed conductive surfaces of structure 200. In one embodiment, the exposed conductive surfaces of structure 200 include barrier material 240 or a seed material overlying barrier material 240 and possibly contact point 220. Suitable materials for shunt material 280A are similar to those described above, and include electroless metals such as cobalt and nickel, and their alloys, including alloys containing noble and refractory metals as well as metalloids such as phosphorous and boron. Referring to FIG. 4, shunt material 280A lines the side walls and bottom of via 270 and trench 275.

Following the introduction of shunt material 280A, conformally about via 270 and trench 275, structure 200 may be annealed to improve the adhesion of shunt material 280A to barrier material 240. In one embodiment, structure 200 is annealed in a reducing ambient such as nitrogen and hydrogen, hydrogen alone, or argon and hydrogen. Alternatively, structure 200 may be annealed in a vacuum.

Figure 5:
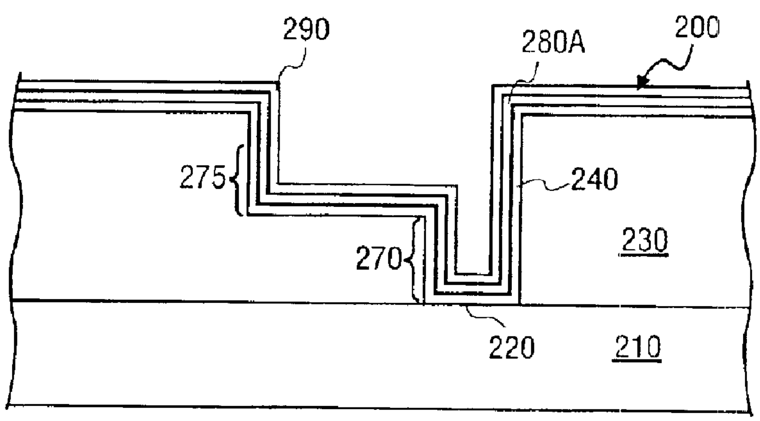
FIG. 5 shows the structure of FIG. 4 after the introduction of seed material over the shunt material.

Following the introduction of shunt material 280A and a subsequent anneal, seed material 290 is introduced as shown in FIG. 5 over shunt material 280A to, in one sense, improve the adhesion between shunt material 280A and a subsequently introduced interconnect material. A suitable seed material for a copper interconnect material is a copper-based seed. In one embodiment, a copper-based seed material may be introduced according to a electroless plating process. One way to introduce copper through an electroless plating process is submerging structure 200 in a bath containing copper ion (e.g., 1–5 g/l), EDTA (10–60 g/l), glyoxylic acid as a reducing agent (2–20 g/l), and pH adjusters such as tetramethyl ammonium hydroxide (TMAH) and/or ammonium hydroxide ($NH_4OH$). After the plating of electroless seed material 290, the structure may again be annealed to improve the adhesion of seed material 290 to a subsequently introduced interconnect material. In one example, the anneal is performed in a reducing ambient (nitrogen/hydrogen, hydrogen alone, or argon/hydrogen) or a vacuum.

Figure 6:
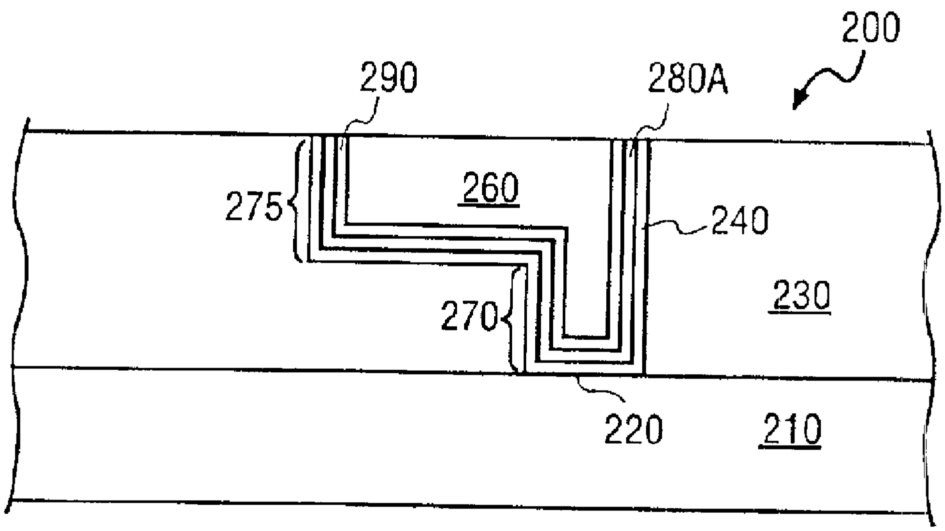
FIG. 6 shows the structure of FIG. 5 after the introduction of interconnect material over the seed material.

FIG. 6 shows structure 200 after the introduction of interconnect material 260. In one embodiment, interconnect material 260 is copper or a copper alloy such as described above. In the case of an alloy, as noted above, the alloy may be plated or the copper introduced and doped. Following the introduction of interconnect material 260 of, for example, copper or a copper alloy, structure 200 may be planarized, if necessary, by, for example, a chemical-mechanical polish to expose dielectric material 230 and to define the interconnect structures.

Figure 7:
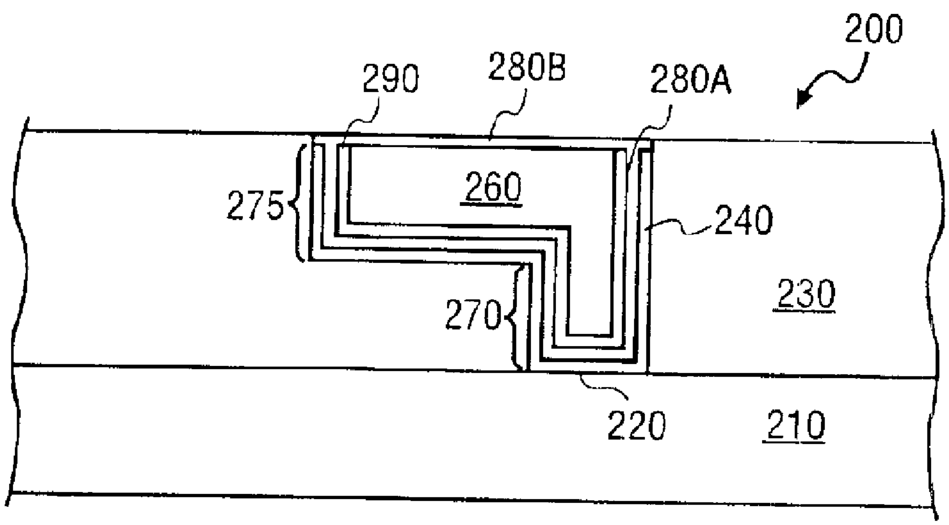
FIG. 7 shows the structure of FIG. 6 after the introduction of a shunt material cap.

Referring to FIG. 7, shunt material 280B may at this point be optionally introduced to encapsulate interconnect material 260. Suitable materials for shunt material 280B are similar to those described above, and include cobalt and nickel, and their alloys, including alloys containing noble and refractory metals as well as metalloids such as phosphorous and boron. The introduction of shunt material 280B may be accomplished as described above with reference to FIG. 2 and shunt material 180 such as by a chemically-induced oxidation-reduction reaction or electroless plating process.

Encapsulated interconnect structure, i.e., interconnect structure with encapsulated interconnect material 260 provides a mechanical frame to support interconnect material 260. Encapsulating interconnection material 260 improves the electromigration performance particularly where dielectric material 230 is a low k dielectric material that may be softer than $SiO_2$. The encapsulated interconnect structure also provides an additional barrier around interconnect material 260. In the case of copper interconnect material, it has been observed that electromigration performance is limited by surface diffusion along copper interconnect lines. By encapsulating the copper material with shunt materials 280A and 280B, the surface diffusion may be limited thus improving electromigration performance.

The electroless plating process described above with respect to the encapsulated structure also describes an electroless introduction of a copper seed material. The electroless plating of seed material can replace the traditional physical deposition introduction of seed material.

In addition to the benefits noted above with respect to the encapsulated structure, the benefits seen with the shunt material cap in reference to FIG. 2 and the accompanying text are also experienced with the encapsulated structure shown in FIG. 7. Namely, shunt material 280B will improve adhesion of the interconnect structure to an overlying dielectric material, including a silicon nitride etch stop layer typically introduced as an interlayer material. Shunt material 280B can also eliminate the need for an additional etch stop layer such as silicon nitride as shunt material 280B can serve such purpose. In this manner, improved dielectric materials, including improved low k dielectric material may be used to isolate the interconnect structures. Still further, as noted above, shunt material 280B will also reduce hillock or blister formation during subsequent anneal processes and will also improve the ware resistance of interconnect material 260.

Figure 8:
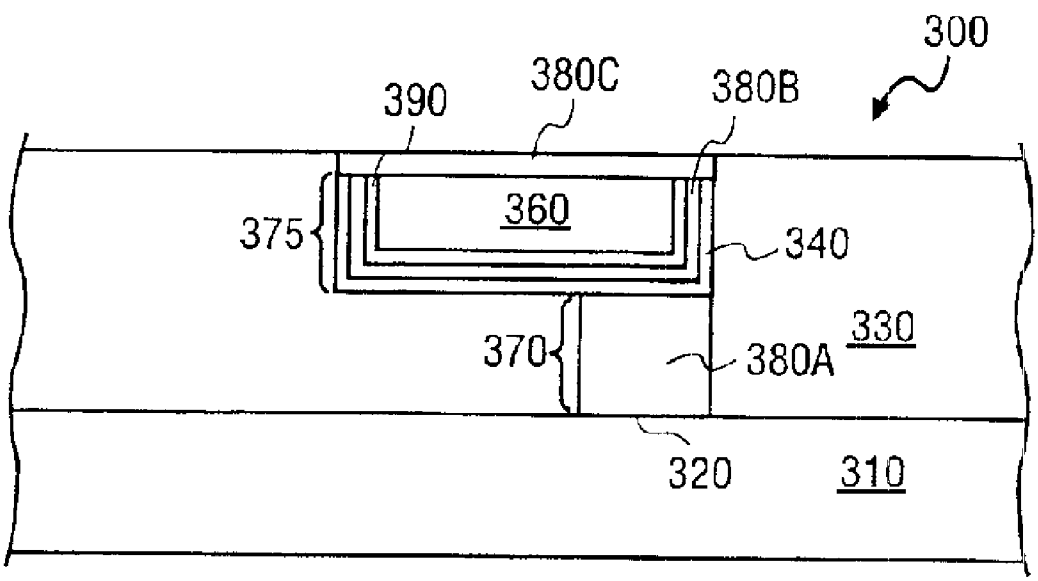
FIG. 8 shows a schematic, cross-sectional side view of an interconnect structure including a via substantially filled with shunt material and interconnect material encapsulated by shunt material.

FIG. 8 shows another embodiment of an interconnect structure. FIG. 8 shows structure 300 that is a portion of an integrated circuit structure similar to structures 100 and 200 described above. Structure 300 includes substrate 310 having contact point 320 that is, for example, a circuit device including a transistor or an interconnect. Overlying contact point 320 is an interconnect structure formed in via 370 and trench 375 through dielectric material 330. The interconnect structure includes shunt material 380A introduced in via 370. In this embodiment, shunt material 380A substantially fills via 370. Shunt material 380A may be introduced by a chemically-induced oxidation-reduction reaction or electroless plating process, using contact point 320 as a surface to initiate the plating process. Alternatively, a barrier material such as described above may be introduced along the side walls and base of trench and via 370 prior to introduction of shunt material 380A.

FIG. 8 shows barrier material 340 introduced along the side walls and base of trench 375. In this embodiment, barrier/seed material is omitted from the via and, instead, shunt material 380A substantially fills via 370. Overlying barrier material 340 is optional shunt material 380B. Overlying shunt material 380B is optional seed material 390 of, for example, electroless plated copper. Interconnect material 360 of, for example, copper or a copper alloy, is introduced within trench 375 to fill the trench. Shunt material 380C is optionally introduced to encapsulate interconnect material 360 similar to the shunt material cap described above with reference to FIG. 2. Suitable materials for shunt material 380A, shunt material 380B, and shunt material 380C are similar to those described above, and include cobalt and nickel, and their alloys, including alloys containing noble and transition metals as well as phosphorous and boron.

Advantages of selectively filling via 370 with shunt material includes that the resulting interconnect structure provides low contact resistance by eliminating an interface between plugs and metal layers where such plugs (e.g., W) may have been used in prior art processes. The introduction of shunt material 380A in via 370, particularly by a chemically-induced oxidation-reduction reaction or electroless plating process also reduces gap-fill problems seen in plating copper into via in the prior art. The reduction in gap-fill problems improves the vias resistance and thus the interconnect performance. While not wishing to be bound by theory, it is believed that the gap-fill problems may be avoided since the electroless process essentially glows shunt material 280A from the surface of the underlying conductive surface, thus reducing the possibility of such via forming.

Methodologies used to introduce the above-mentioned materials and structures by electroless plating include submerging the substrate (wafer) to be plated into an electroless plating bath. Typically, the wafer is held in an apparatus with seals to prevent exposure of the backside of the wafer to plating chemicals (thereby reducing the potential for backside metal contamination of the wafer). A wafer holder may hold the wafer with the device side (where circuits are or are to be formed) face down or face up, which may reduce complications to the deposition due to gas evolution during the plating process. The temperatures required to facilitate the desired reaction may be achieved by heating the wafer, heating the bath or a combination of the two. In another embodiment, a dispensed plating is suitable. In this process, chemicals are dispensed onto the device side of the wafer while again the backside is protected from exposure. This configuration may have the advantage of limiting the interaction between reducing and oxidizing agents to tubing or other apparatus situated very close to the target wafer. Consequently, little or no depletion of the metal ions to be deposited occurs due to decomposition of the plating fluids. Again, the reaction temperatures are achieved by heating the wafer, the plating chemicals or both. In another embodiment, electroless deposition is performed on a wafer scrubber. A scrubber typically consists of cylindrical rotating pads which mechanically remove debris from both sides of the wafer. The scrubbing step is typically, the final step of a chemical mechanical polish (CMP) process. Since shunt material introduction as described above typically follows CMP, electroless introduction on a wafer scrubber allows for integration of the electroless process onto a single CMP tool.

In the preceding detailed description improved interconnect structures incorporating a shunt material and techniques of forming such structures are presented. The invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

introducing a barrier material in an opening through a dielectric over a contact point;

introducing a conductive shunt material on the barrier material through a chemically-induced oxidation-reduction reaction;

forming an interconnect structure in the opening over the conductive shunt material; and forming a conductive shunt structure over an exposed portion of the interconnect structure through a chemically-induced oxidation-reduction reaction.

2. The method of claim 1, wherein forming the shunt structure comprises introducing a shunt material precursor in the presence of an alkaline metal-free reducing agent in the presence of a non-metallic chelating agent.

3. The method of claim 1, further comprising:

forming the shunt structure in an alkaline environment with a pH adjusted by an alkaline metal-free pH adjuster.

4. The method of claim 1, further comprising:

prior to forming the shunt structure, modifying the exposed surface of the interconnect structure.

5. The method of claim 4, wherein modifying the surface of the interconnect structure comprises one of stripping with a stripping agent and doping with a dopant.

6. The method of claim 1, wherein forming the interconnect structure comprises:

introducing a seed material on the conductive shunt material; and introducing interconnect material on the seed material.

7. The method of claim 6, wherein forming the interconnect structure further includes introducing a seed material following the introduction of the barrier material.

8. The method of claim 6, wherein the opening through the dielectric material comprises a via having a cross-sectional area and a volume, and a trench to the via having a cross-sectional area greater than the cross-sectional area of the via, and introducing the shunt material precursor comprises introducing the shunt material precursor in an amount such that the shunt structure thus formed substantially fills the volume of the via.

9. The method of claim 1, wherein forming the shunt structure comprises:

placing a substrate comprising the interconnect structure in a bath comprising the shunt material precursor.

10. The method of claim 9, further comprising, prior to placing the substrate in the bath, protecting a portion of the substrate to exposure to the components of the bath.

11. The method of claim 1, wherein forming the shunt structure comprises:

dispensing the shunt material precursor onto the interconnect structure.

12. The method of claim 1, wherein forming the shunt structure comprises:

placing a substrate comprising the interconnect structure in a wafer scrubber; and while in the wafer scrubber exposing the interconnect structure to the shunt material precursor.

13. A method comprising:

introducing a conductive shunt material in an opening through a dielectric to a contact point, wherein the opening defines a via having a cross-sectional area and a volume, and a trench to the via having a cross-sectional area greater than the cross-sectional area of the via;

introducing an interconnect structure material on the conductive shunt material;

introducing a conductive shunt material precursor having an oxidation number on an exposed surface of the interconnect structure; and reducing the oxidation number of the shunt material precursor.

14. The method of claim 13, further comprising prior to reducing the oxidation number of the shunt material precursor, introducing a reducing agent.

15. The method of claim 14, wherein the reducing agent comprises an alkaline metal-free material.

16. The method of claim 13, further comprising:

reducing the oxidation number of the shunt material precursor in the presence of a non-metallic chelating agent.

17. The method of claim 13, further comprising:

reducing the oxidation number of the shunt material precursor in an alkaline environment.

18. The method of claim 13, further comprising:

prior to introducing the shunt material precursor, modifying the exposed surface of the interconnect structure.

19. The method of claim 18, wherein modifying the surface of the interconnect comprises one of stripping with a stripping agent and doping with a dopant.

20. The method of claim 13, wherein introducing the interconnect structure comprises introducing a barrier material and an interconnect material.

21. The method of claim 20, wherein introducing the interconnect structure material further includes introducing a seed material following the introduction of the barrier material.

22. The method of claim 20, wherein introducing the shunt material comprises introducing the shunt material to substantially fill the volume of the via.

23. A method, comprising:

forming a via in a dielectric material to expose a contact point;

forming a trench in a portion of the dielectric material over the via;

introducing a conductive shunt material precursor in the via in an amount to substantially fill a volume of the via through a chemically induced oxidation-reduction reaction; and forming an interconnect structure in the trench and on the conductive material over the via.

24. The method of claim 23, further comprising:

forming a conductive shunt structure on an exposed portion of the interconnect structure through a chemically-induced oxidation-reduction reaction.

25. The method of claim 23, wherein forming the interconnect structure comprises:

introducing a barrier material along sidewalls and a base of the trench overlying the via; and introducing an interconnect material on the barrier material to substantially fill a volume of the trench.

26. The method of claim 23, wherein forming the interconnect structure comprises:

introducing a barrier material along sidewalls and a base of the trench overlying the via;

introducing a conductive shunt material on the barrier material through a chemically induced oxidation-reduction reaction;

introducing a seed material on the conductive shunt material; and introducing an interconnect material over the seed material to substantially fill a volume of the trench.

* * * * *